United States Patent
Tuominen et al.

(10) Patent No.: US 10,312,194 B2
(45) Date of Patent: Jun. 4, 2019

(54) STACKED ELECTRONICS PACKAGE AND METHOD OF MANUFACTURING THEREOF

(71) Applicant: General Electric Company, Schenectady, NY (US)

(72) Inventors: Risto Ilkka Tuominen, Tokyo (JP); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/343,259

(22) Filed: Nov. 4, 2016

(65) Prior Publication Data

US 2018/0130747 A1 May 10, 2018

(51) Int. Cl.
*H01L 23/538* (2006.01)
*H01L 25/18* (2006.01)
(Continued)

(52) U.S. Cl.
CPC ...... *H01L 23/5386* (2013.01); *H01L 23/5383* (2013.01); *H01L 23/5384* (2013.01);
(Continued)

(58) Field of Classification Search
CPC ............. H01L 25/0652; H01L 23/3128; H01L 23/485; H01L 23/5386; H01L 23/5383;
(Continued)

(56) References Cited

U.S. PATENT DOCUMENTS 7,791,897 B2 9/2010 Das et al.
8,049,338 B2 11/2011 Delgado et al.
(Continued)

FOREIGN PATENT DOCUMENTS

JP 2015177163 A 10/2015
WO 0067538 A1 11/2000

OTHER PUBLICATIONS

Park et al., "Dielectric Composite Material with Good Performance and Process Ability for Embedding of Active and Passive Components into PCBs," Electronic Components and Technology Conference (ECTC), 2013 IEEE 63rd, pp. 1325-1331, Las Vegas, NV.
(Continued)

*Primary Examiner* — Cuong Q Nguyen
*Assistant Examiner* — Tong-Ho Kim
(74) *Attorney, Agent, or Firm* — Ziolkowski Patent Solutions Group, SC (57) ABSTRACT

An electronics package includes an insulating substrate, a first electrical component coupled to a top surface of the insulating substrate, and a second electrical component coupled to a bottom surface of the insulating substrate. A first conductor layer is formed on the bottom surface of the insulating substrate and extends through a via formed therethrough to contact a contact pad of the first electrical component, with a portion of the first conductor layer positioned between the insulating substrate and the second electrical component. A second conductor layer is formed on the top surface of the insulating substrate and extends through another via formed therethrough to electrically couple with the first conductor layer and to contact a contact pad of the second electrical component.

24 Claims, 9 Drawing Sheets

(51) Int. Cl.
*H01L 25/00* (2006.01)
*H01L 23/00* (2006.01)
*H01L 25/16* (2006.01)

(52) U.S. Cl.
CPC .......... *H01L 23/5389* (2013.01); *H01L 24/19* (2013.01); *H01L 24/20* (2013.01); *H01L 24/24* (2013.01); *H01L 24/25* (2013.01); *H01L 24/82* (2013.01); *H01L 25/16* (2013.01); *H01L 25/18* (2013.01); *H01L 25/50* (2013.01); *H01L 2224/04105* (2013.01); *H01L 2224/12105* (2013.01); *H01L 2224/24146* (2013.01); *H01L 2224/2518* (2013.01); *H01L 2224/25171* (2013.01); *H01L 2224/25174* (2013.01); *H01L 2224/291* (2013.01); *H01L 2224/2919* (2013.01); *H01L 2224/29139* (2013.01); *H01L 2224/32225* (2013.01); *H01L 2224/32245* (2013.01); *H01L 2224/73267* (2013.01); *H01L 2224/83851* (2013.01); *H01L 2224/9222* (2013.01); *H01L 2224/92144* (2013.01); *H01L 2924/13055* (2013.01); *H01L 2924/143* (2013.01)

(58) Field of Classification Search
CPC . H01L 23/5384; H01L 23/5389; H01L 24/19; H01L 24/24; H01L 24/25; H01L 25/18; H01L 25/50; H01L 2224/24146; H01L 2224/25171; H01L 2224/25174; H01L 2224/2518
USPC .................................................. 257/668, 737
See application file for complete search history.

(56) References Cited

U.S. PATENT DOCUMENTS

| | | | |
|---|---|---|---|
| 8,114,712 B1 | 2/2012 | McConnelee et al. | |
| 8,368,201 B2 | 2/2013 | Tuominen | |
| 8,466,007 B2 | 6/2013 | Delgado et al. | |
| 8,716,870 B2 | 5/2014 | Gowda | |
| 8,778,738 B1 | 7/2014 | Lin et al. | |
| 8,987,876 B2 | 3/2015 | Gowda et al. | |
| 9,177,957 B1 | 11/2015 | Lee et al. | |
| 9,209,151 B2 | 12/2015 | Chauhan et al. | |
| 2007/0155057 A1* | 7/2007 | Wang | H01L 23/5389 438/122 |
| 2007/0235810 A1* | 10/2007 | Delgado | H01L 23/5389 257/356 |
| 2008/0136002 A1 | 6/2008 | Yang | |
| 2008/0296056 A1 | 12/2008 | Kinoshita et al. | |
| 2008/0318027 A1 | 12/2008 | Woychik et al. | |
| 2009/0039510 A1 | 2/2009 | Jobetto | |
| 2009/0072379 A1* | 3/2009 | Ewe | H01L 21/4821 257/700 |
| 2010/0052129 A1 | 3/2010 | Iihola et al. | |
| 2010/0059854 A1 | 3/2010 | Lin et al. | |
| 2011/0068461 A1 | 3/2011 | England | |
| 2012/0018876 A1 | 1/2012 | Wu et al. | |
| 2012/0112345 A1 | 5/2012 | Blackwell et al. | |
| 2013/0075924 A1 | 3/2013 | Lin et al. | |
| 2013/0093097 A1 | 4/2013 | Yu et al. | |
| 2014/0264799 A1 | 9/2014 | Gowda et al. | |
| 2015/0083469 A1 | 3/2015 | Sunohara et al. | |
| 2015/0084207 A1* | 3/2015 | Chauhan | H01L 24/26 257/774 |
| 2015/0115458 A1 | 4/2015 | Palm | |
| 2015/0179616 A1 | 6/2015 | Lin et al. | |
| 2015/0380356 A1 | 12/2015 | Chauhan et al. | |
| 2016/0056136 A1 | 2/2016 | McConnelee et al. | |
| 2016/0148887 A1 | 5/2016 | Yu et al. | |
| 2016/0172344 A1 | 6/2016 | We et al. | |

OTHER PUBLICATIONS

Braun et al., "Through Mold Vias for Stacking of Mold Embedded Packages," Electronic Components and Technology Conference (ECTC), 2011 IEEE 61st, pp. 48-54, May 31-Jun. 3, 2011, Lake Buena Vista, FL.

* cited by examiner

STACKED ELECTRONICS PACKAGE AND METHOD OF MANUFACTURING THEREOF

BACKGROUND OF THE INVENTION

Embodiments of the invention relate generally to semiconductor device packages or electronics packages and, more particularly, to an electronics package that includes a plurality of electronics devices arranged in a stacked configuration. In some embodiments, the stacked electronics devices are provided in combination with a conductor with locally varied thicknesses. This multi-thickness conductor includes a combination of regions having high current carrying capabilities and high density routing capabilities and facilitates the integration of different types of electronics devices in a miniaturized package topology.

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Advancements in semiconductor chip packaging technology are driven by ever-increasing needs for achieving better performance, greater miniaturization, and higher reliability.

Figure 1:
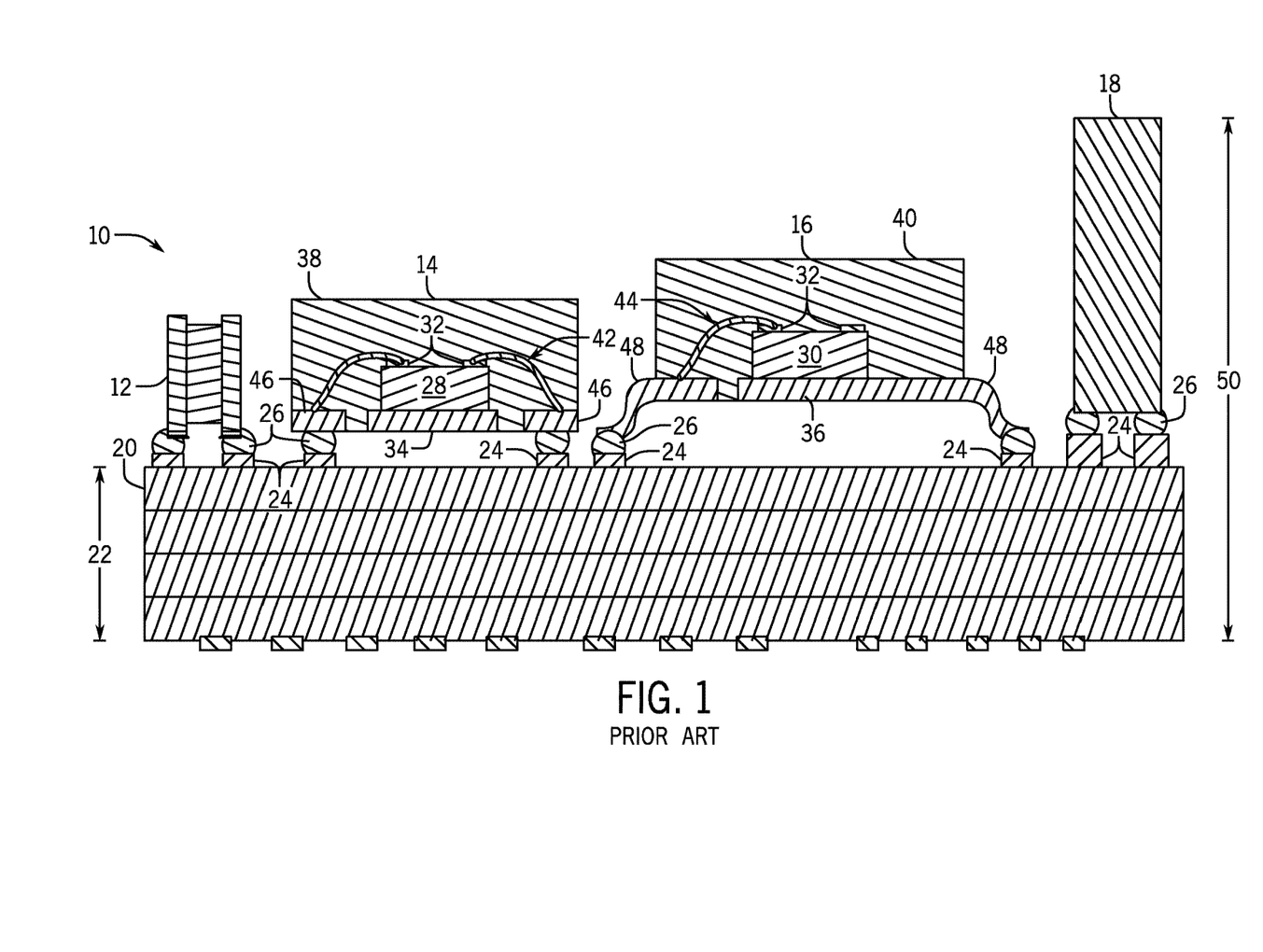
FIG. 1 is a schematic cross-sectional side view of a prior art electronics package incorporating a mixture of different types of semiconductor devices.

A challenge to existing manufacturing techniques is the miniaturization of electronics packages that incorporate different types of individually packaged semiconductor dies that have different current carrying and routing density requirements, such as a mixture digital semiconductor devices and power semiconductor devices. The general structure of a prior art electronics package 10 incorporating a number of individually packaged components 12, 14, 16, 18 is shown in FIG. 1. The individually packaged components 12, 14, 16, 18 are mounted on a multi-layer printed circuit board (PCB) 20 that has a thickness 22 of approximately 31 to 93 mils. The individually packaged components 12, 14, 16, 18 may be power semiconductor packages, packaged controllers, or other discrete electrical components such as inductors or passive components that are coupled to electrical contacts 24 of PCB 20 using metalized connections 26 such as, for example, solder balls in the form of a ball grid array (BGA).

In the illustrated example, individually packaged devices 14, 16 each include a respective semiconductor device or die 28, 30 having contact pads 32 formed on an active surface thereof. Die 28, 30 are provided on a mounting platform 34, 36 and encased within an insulating material 38, 40. Wirebonds 42, 44 form direct metal connections between active surfaces of respective die 28, 30 and a metalized input/output (I/O) provided on or coupled to the lower surface of die 28, 30. In the case of discrete component 14, wirebonds 42 form an electrical connection between contact pads 32 of die 28 to I/O pads 46 provided on a bottom surface of discrete component 14. Wirebond 42 electrically couples contact pads 32 to I/O leads 48. Where die 30 is a diode, for example, wirebond 42 may connect to the anode on a first surface of the die 30 and a second surface of the die 30 may be soldered to the leadframe. I/O pads 46 and I/O leads 48 are coupled to electrical contacts 24 of PCB 20 by way of metalized connections 26. The overall thickness 50 of such prior art IC packages may be in the range of 500 µm-2000 µm or larger.

The substantial thickness of the prior art arrangement of individually packaged devices limits product level miniaturization, design flexibility, and cost efficiency. Additionally, the prior art arrangement includes multiple routing layers, which results in a long and complex conductor structure between electrical components and weakens the electrical performance of the overall package, which is increasingly unfavorable in high performance packaging (e.g., high frequency, RF, intelligent power, and other advanced electronics packaging).

Accordingly, it would be desirable to provide a new electronics packaging technology that permits electrical components of different types to be integrated into a highly miniaturized electronics package with locally enhanced electrical and thermal conductivity for certain electronics components and increased routing density in regions proximate other electronics components. It would further be desirable for such a packaging technology to permit a shorter conductor length between electrical components and improve signal fidelity.

BRIEF DESCRIPTION OF THE INVENTION

In accordance with one aspect of the invention, an electronics package includes an insulating substrate, a first electrical component coupled to a top surface of the insulating substrate, and a second electrical component coupled to a bottom surface of the insulating substrate. A first conductor layer is formed on the bottom surface of the insulating substrate and extends through a via formed therethrough to contact a contact pad of the first electrical component, with a portion of the first conductor layer positioned between the insulating substrate and the second electrical component. A second conductor layer is formed on the top surface of the insulating substrate and extends through another via formed therethrough to electrically couple with the first conductor layer and to contact a contact pad of the second electrical component.

In accordance with another aspect of the invention, a method of manufacturing an electronics package includes coupling a first electrical component to a top surface of an insulating substrate and forming a first conductor layer on a bottom surface of the insulating substrate, where the first conductor layer extends through at least one via in the insulating substrate to electrically couple with at least one contact pad of the first electrical component. The method also includes coupling a second electrical component to the bottom surface of the insulating substrate such that a portion of the first conductor layer is positioned therebetween and forming a second conductor layer on a top surface of the insulating substrate, the second conductor layer extending through another via in the insulating substrate to electrically couple with the first conductor layer. The second conductor layer is electrically coupled to at least one contact pad of the second electrical component.

In accordance with yet another aspect of the invention, a stacked electronics package includes a pair of electrical components coupled to opposing surfaces of an insulating substrate in a stacked configuration wherein an active surface of one electrical component faces an active surface of the other electrical component. A first conductor layer is formed on a first surface of the insulating substrate and is electrically coupled to one electrical component through a via formed in the insulating substrate. A second conductor layer is formed on a second surface of the insulating substrate and is electrically coupled to the other electrical component through another via formed in the insulating substrate. A portion of the first conductor layer is positioned between the pair of electrical components.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for an electronics package that includes multiple semiconductor devices, dies, or chips coupled to a patterned conductor layer in a stacked arrangement. The patterned conductor layer is formed on opposing surfaces of an insulating substrate, extends through the insulating substrate, and includes regions with locally varying thicknesses and differing routing density and current carrying capabilities. As described in more detail below, portions of the multi-thickness conductor layer include a low density L/S routing pattern that provides the requisite current carrying capabilities for one type of electrical component, such as a power semiconductor die, while other, thinner portions of the conductor layer have a high density routing pattern that enables routing capability below 100/100 µm L/S for another type of electrical component, such as a digital semiconductor die. The multi-thickness conductor layer is configured to permit a pair of die to be positioned in a stacked arrangement, resulting in a miniaturized package configuration.

As used herein, the phrase "power semiconductor device" refers to a semiconductor component, device, die or chip designed to carry a large amount of current and/or support a large voltage. Power semiconductor devices are typically used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include two (2) to four (4) input/output (I/O) interconnections to electrically connect both sides of a respective power semiconductor device to an external circuit.

As used herein, the phrase "digital semiconductor device" refers to a semiconductor component, device, die, or chip provided in the form of a digital logic device, such as a microprocessor, microcontroller, memory device, video processor, or an Application Specific Integrated Circuit (ASIC), as non-limiting examples. As is understood in the art, digital semiconductor devices have reduced current carrying requirements and require increased routing density as compared to power semiconductor devices due to the differences in interconnection pitch and number of I/Os between the device types. A digital semiconductor device may include anywhere between ten and thousands of I/Os depending on the device configuration.

While the electrical components embedded in the electronics package are referenced below in the embodiments of FIGS. 2-21 specifically as one or more power semiconductor devices in combination with one or more digital semiconductor devices, it is understood that other combinations of differently configured electrical components could be substituted in the electronics package, and thus embodiments of the invention are not limited only to the embedding of power devices and digital devices in a common electronics package. That is, the techniques of stacking electrical components and using locally varied planar conductor thicknesses may be extended to electronics packages with any combination of electrical components having differing current carrying capabilities and routing density structures. Thus, the electronics package embodiments described below should also be understood to encompass electronics packages including resistors, capacitors, inductors, filters, or other similar devices, provided either alone or in combination with one or more power and/or digital devices. Additionally, while the embodiments of FIGS. 2-21 are described as including one power device and one digital device, it is contemplated that the concepts described herein may be extended to electronics packages that include any combination of three or more electrical components.

Referring now to FIGS. 2-10, cross-sectional views showing the various build up steps of a technique for manufacturing an electronics package 100 are illustrated according to an embodiment of the invention. A cross-section of the build-up process for a singular electronics package 100 is shown in FIGS. 2-10 for ease of visualization of the build-up process. However, one skilled in the art will recognize that multiple electronics packages could be manufactured in a similar manner at the panel level and then singulated into individual electronics packages as desired. As described in detail below, electronics package 100 is a multi-chip package that includes a combination of different semiconductor devices or die 102, 104. In the illustrated embodiment described herein, die 102 is a power semiconductor device and die 104 is a digital semiconductor device. However, electronics package 100 may include any combination of electrical components requiring different current carrying and routing density capabilities in alternative embodiments.

Figure 2:
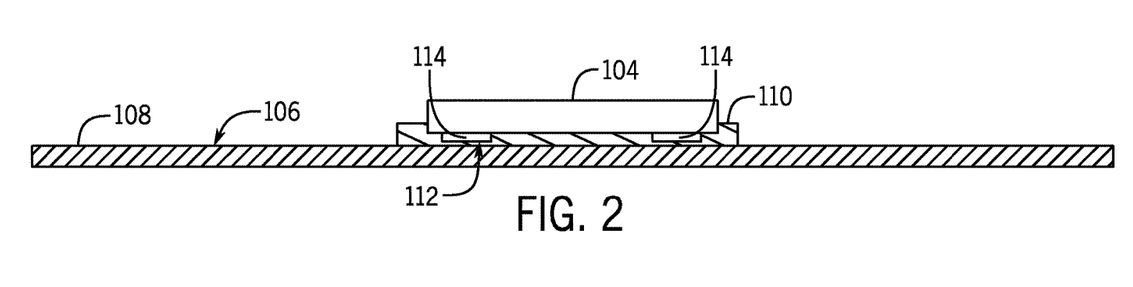
FIGS. 2-10 are schematic cross-sectional side views of an electronics package including a redistribution layer during various stages of a manufacturing/build-up process, according to an embodiment of the invention.

Referring first to FIG. 2, the manufacturing technique begins by coupling digital semiconductor device 104 to the top surface 106 of insulating substrate 108 with a layer of insulating material 110. As used herein the phrase "insulating material" refers to an electrically insulating material that adheres to surrounding components of the electronics package such as a polymeric material (e.g., epoxy, liquid crystal polymer, ceramic or metal filled polymers) or other organic material as non-limiting examples. In some embodiments, insulating material 110 may be provided in either an uncured or partial cured (i.e., B-stage) form. According to various embodiments, insulating substrate 108 may be provided in the form of an insulating film or dielectric substrate, such as for example a Kapton® laminate flex, although other suitable materials may also be employed, such as Ultem®, polytetrafluoroethylene (PTFE), or another polymer film, such as a liquid crystal polymer (LCP) or a polyimide substrate, as non-limiting examples.

In the illustrated embodiment, insulating material 110 is limited to a select portion of top surface 106 of insulating substrate 108, however, insulating material 110 may be applied to coat the entirety of top surface 106 in alternative embodiments. Insulating material 110 may be applied using a coating technique such as spin coating or slot die coating, using a lamination or spray process, or may be applied by a programmable dispensing tool in the form of an inkjet printing-type device technique, as non-limiting examples. Alternatively, insulating material 110 may be applied to digital semiconductor device 104 prior to placement on insulating substrate 108.

Digital semiconductor device 104 is positioned into insulating material 110 using conventional pick and place equipment and methods. As shown, digital semiconductor device 104 is positioned with respect to insulating substrate 108 such that a top surface or active surface 112 comprising electrical contact pads 114, contact elements or connection pads is positioned into insulating material 110. Contact pads 114 provide conductive routes (I/O connections) to internal contacts within digital semiconductor device 104 and may have a composition that includes a variety of electrically conductive materials such as aluminum, copper, gold, silver, nickel, or combinations thereof as non-limiting examples. As understood in the art, the number of contact pads 114 on digital semiconductor device 104 is dependent upon the complexity and intended functionality of device 104. The pad pitch (i.e., the center-to-center distance between adjacent contact pads) is inversely proportional to the number of contact pads 114 provided on digital semiconductor device 104. While not shown in the illustrated embodiment, it is contemplated that other discrete or passive devices, such as, for example, a resistor, a capacitor, or an inductor, may be affixed to insulating substrate 108 by way of insulating material 110 alone or in combination with one or more semiconductor devices.

After digital semiconductor device 104 is positioned, insulating material 110 is fully cured, thermally or by way of a combination of heat or radiation. Suitable radiation may include UV light and/or microwaves. In one embodiment, a partial vacuum and/or above atmospheric pressure may be used to promote the removal of volatiles from the insulating material 110 during cure if any are present.

Figure 3:
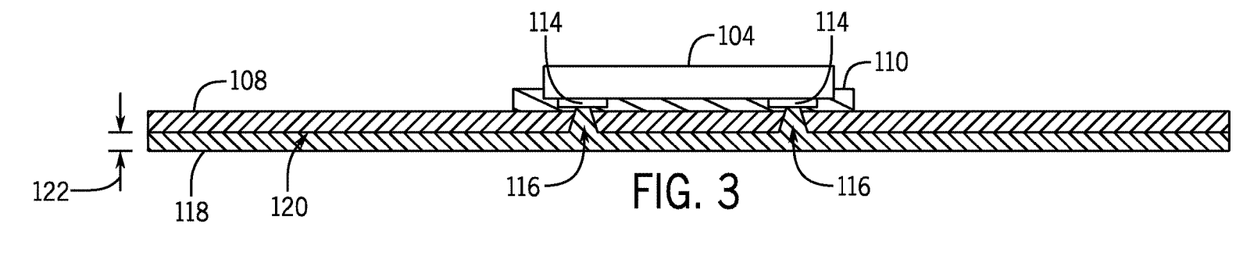

A plurality of vias 116, shown in FIG. 3, are formed through insulating substrate 108 and insulating material 110. As shown, vias 116 expose contact pads 114 of digital semiconductor device 104. Vias 116 may be formed by a UV laser drilling or dry etching, photo-definition, or mechanical drilling process as non-limiting examples. Alternately, vias 116 may be formed by way of other methods including: plasma etching, dry and wet etching, or other laser techniques like CO2 and excimer. In one embodiment, vias 116 are formed having angled side surfaces, as shown in FIG. 3, to facilitate later filling and metal deposition. Vias 116 are subsequently cleaned such as through a reactive ion etching (RIE) desoot process or laser process.

While the formation of vias 116 through insulating substrate 108 and insulating material 110 is shown in FIG. 3 as being performed after placement of digital semiconductor device 104 into insulating material 110, it is recognized that the placement of semiconductor device 104 could occur after via formation. Furthermore, a combination of pre- and post-drilled vias could be employed.

A first conductor layer 118 or metallization layer is formed on the bottom surface 120 of an insulating substrate 108 and extends through vias 116 to electrically connect with contact pads 114 of digital semiconductor device 104. First conductor layer 118 is an electrically conductive metal such as, for example, copper. However, other electrically conducting materials or a combination of metal and a filling agent may be used in other embodiments. First conductor layer 118 may be applied directly to the bottom surface 120 of insulating substrate 108 using a sputtering and electroplating technique or other electroless method of metal deposition. Alternatively, a titanium adhesion layer and copper seed layer 121 (FIG. 7A) may first be applied to the bottom surface 120 of insulating substrate 108 using a sputtering process, followed by an electroplating process that increases a thickness 122 of the first conductor layer 118 to a desired level.

First conductor layer 118 is formed having a thickness 122 that permits formation of a high density L/S pattern for interconnections to the numerous contact pads 114 of digital semiconductor device 104. In an exemplary embodiment, thickness 122 is in the range of approximately 4 µm-30 µm. However, one skilled in the art will recognize that the thickness 122 of first conductor layer 118 may be varied to correspond to the interconnection pitch of a particular digital semiconductor die 104.

Figure 4:
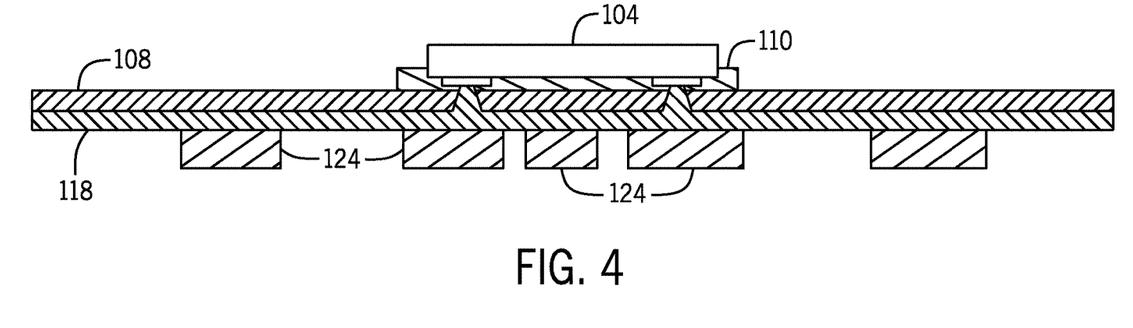
Figure 5:
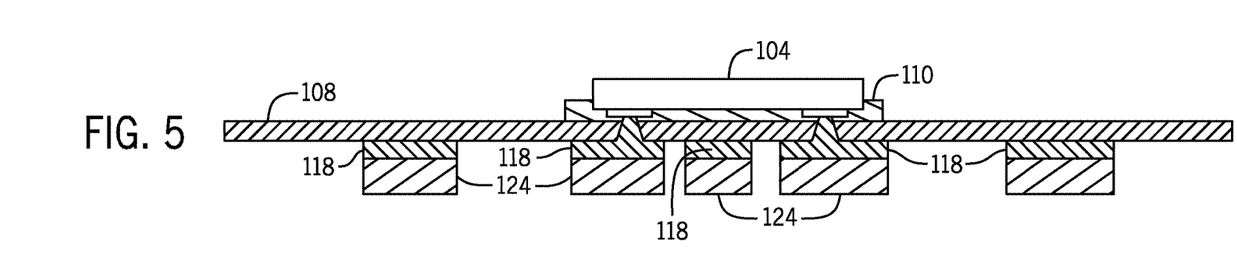

Next a first layer photoresist mask 124, shown in FIG. 4, is formed on first conductor layer 118 and is patterned with openings for a routing layer with a high density routing capability. As used herein, the phrase "high density routing capability" or "high density L/S" pattern refers to a routing capability below 100/100 µm L/S (line/space). With the first layer photoresist mask 124 in place, first conductor layer 118 is subsequently patterned using an etching process to create a first conductor pattern in the form of a high density L/S pattern appropriate for forming electrical connections to digital semiconductor device 104, as shown in FIG. 5.

Figure 6:
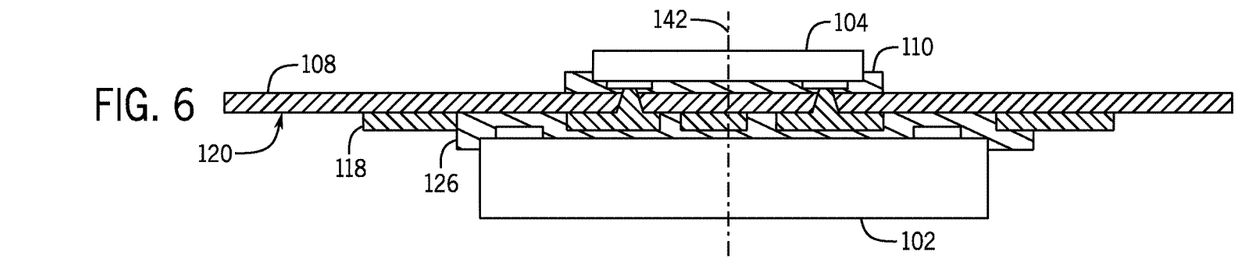
Figure 7:
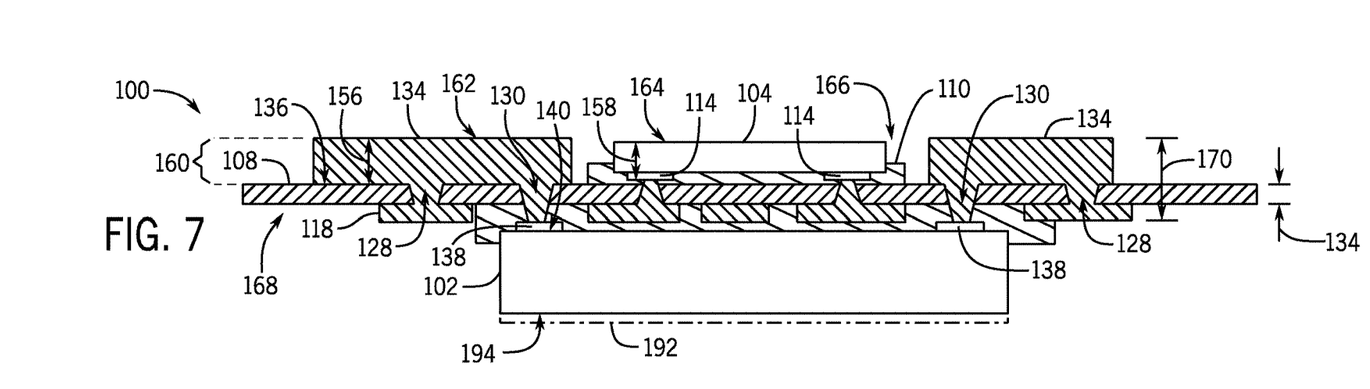
Figure 7A:
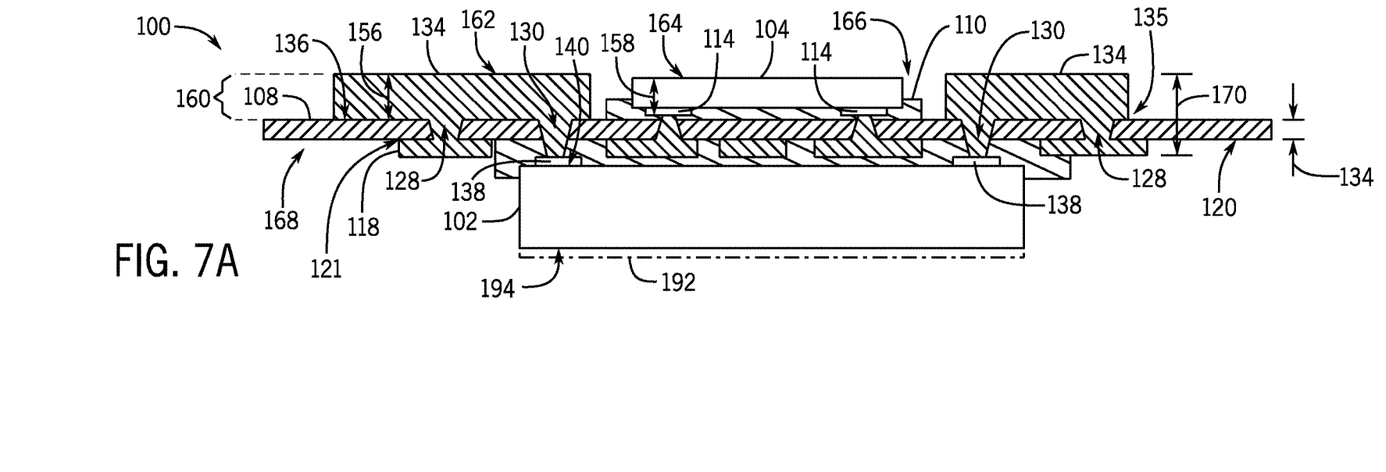

Referring to FIG. 6, any remaining portions of the first layer photoresist mask 124 are removed and a layer of insulating material 126 is used to affix power semiconductor device 102 to the bottom surface 120 of insulating substrate 108. Additional vias 128, 130, shown in FIG. 7, are formed through the thickness 132 of insulating substrate 108 in a similar manner as vias 116. A second conductor layer 134 or metallization layer is then plated on the top surface 136 of insulating substrate 108. Similar to first conductor layer 118, second conductor layer 134 is an electrically conducting material and may be applied using any of the techniques described above with respect to first conductor layer 118. Optionally, a titanium adhesion layer and copper seed layer 135 (FIG. 7A) may first be applied via a sputtering process to the top surface 136 of insulating substrate 108 prior to applying second conductor layer 134. As shown, second conductor layer 134 extends through vias 128, 130 to electrically couple with first conductor layer 118 and contact pads 138 positioned on the top or active surface 140 of power semiconductor device 102.

Similar to contact pads 114 of digital semiconductor device 104, contact pads 138 provide conductive routes (I/O connections) to internal contacts within power semiconductor device 102 and are formed of an electrically conductive material. In the case where power semiconductor device 102 is an IGBT, for example, contact pads 138 are coupled to corresponding emitter and/or gate or anode regions of the power semiconductor device 102. Depending on the device configuration, power semiconductor device 102 may also include at least one lower collector pad or contact pad 192 (shown in phantom) that is disposed on its backside or lower surface 194. Second conductor layer 134 is patterned with a low density L/S routing pattern that forms electrical connections to the contact pads 138 of power semiconductor device 102. In an alternative embodiment, one or both of the first and second conductor layers 118, 134 are formed from a photodefinable polymer using a semi-additive process.

Figure 11:
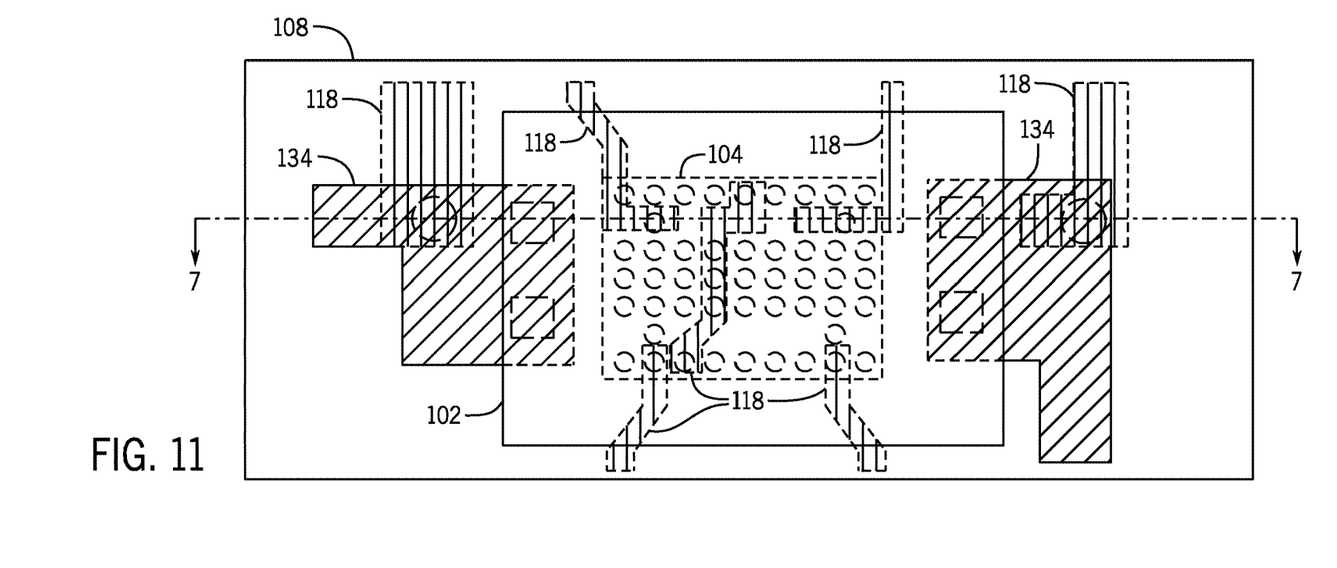
FIG. 11 is a bottom view of the electronics package shown in FIG. 7.

As shown in FIG. 7 and FIG. 11, power semiconductor device 102 and digital semiconductor device 104 are aligned along a common vertical axis 142 in a stacked configuration with a portion of first conductor layer 118 being positioned between power semiconductor device 102 and insulating substrate 108. In the stacked configuration, the contact pads 114 of digital semiconductor device 104 and the contact pads 138 of digital semiconductor device 104 face toward one another.

Figure 12:
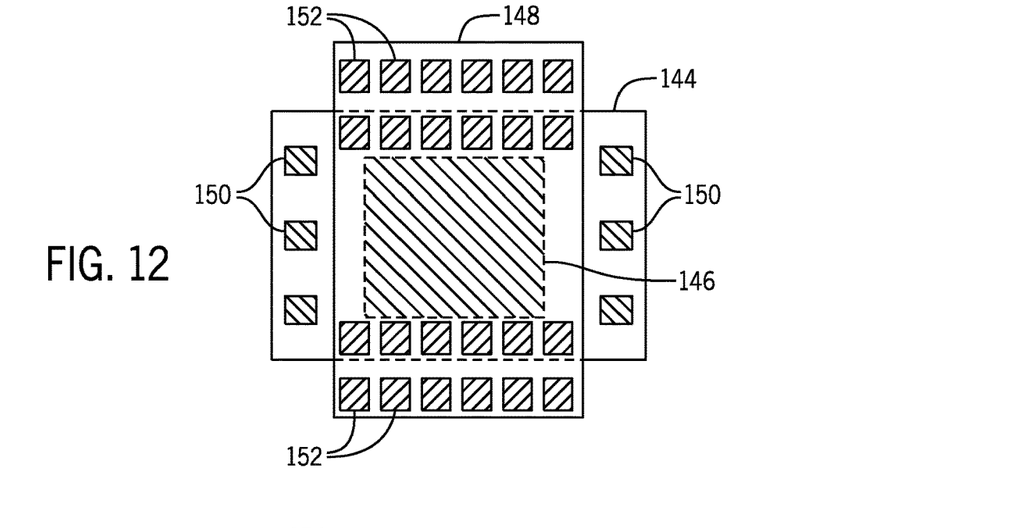
FIGS. 12-14 illustrate layout configurations of two stacked electronics components as viewed from the top side of an electronics package, according to alternative embodiments of the invention.
Figure 13:
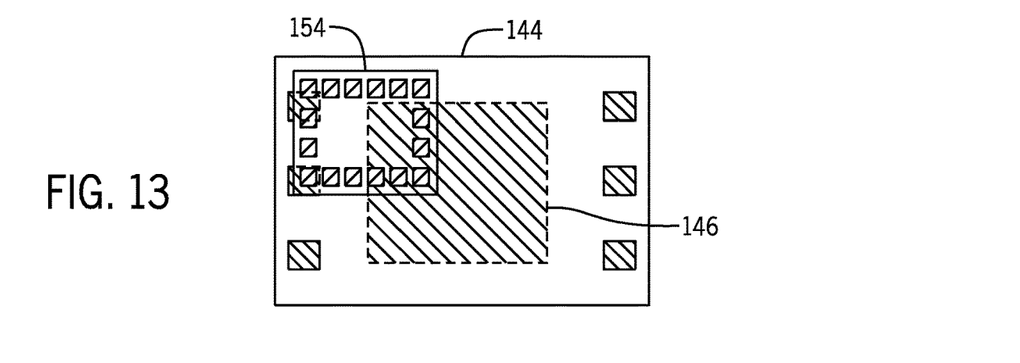
Figure 14:
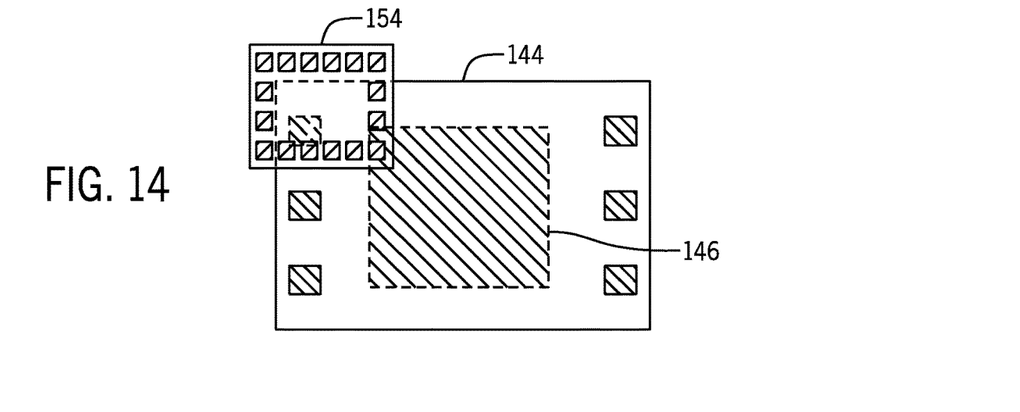

In the embodiment shown in FIG. 7, digital semiconductor device 104 and power semiconductor device 102 are stacked in a symmetrical configuration wherein the bottom component, power semiconductor device 102, wholly overlaps the top component, digital semiconductor device 104, when electronics package 100 is viewed from the bottom. Alternative stacked arrangements of digital semiconductor device 104 and power semiconductor device 102 are shown in FIGS. 12-14. These stacked configurations are to be understood as depicting non-limiting examples of alternative configurations of stacked electronics components that may be integrated into an electronics package such as that shown in FIG. 7. For purposes of clarity, all other components of the electronics package have been omitted.

In the embodiment of FIG. 12, a power semiconductor device 144 having a backside contact pad 146 and a digital semiconductor device 148 are stacked in a symmetrical arrangement in the y-axis or thickness direction of the package but rotated with respect to one another such that a portion of power semiconductor device 144 extends beyond two side edges of digital semiconductor device 148 and a portion of the digital semiconductor device 148 extends beyond two side edges of power semiconductor device 144 to facilitate formation of conductive I/O connection to respective contact pads 150, 152 of devices 144, 148.

Alternatively, digital semiconductor device 154 and power semiconductor device 144 may be horizontally offset from one another within electronics package 100 in an asymmetrical stacked arrangement. In such embodiments, a digital semiconductor device 154 may either be stacked wholly above the power semiconductor device 144, as shown in FIG. 13, or partially above power semiconductor device 144 such that a portion thereof extends beyond the outer perimeter of the power semiconductor device 144, as shown in FIG. 14. In embodiments that include three or more electrical components, additional electronics components may be positioned adjacent digital semiconductor device 154 in either a partially or a wholly stacked arrangement.

Referring again to FIG. 7, in some embodiments the thickness 156 of second conductor layer 134 is greater than or substantially equal to the thickness 158 of digital semiconductor device 104. The relative thicknesses 156, 158 of second conductor layer 134 and digital semiconductor device 104 beneficially permit digital semiconductor device 104 and second conductor layer 134 to be positioned within a common plane 160 of the electronics package 100 defined between the top surface 136 of insulating substrate 108 and the top surface 162 of second conductor layer 134. Thus, the top surface 162 of second conductor layer 134 is either substantially coplanar with or extends above the non-active surface or second surface 164 of digital semiconductor device 104. The increased thickness of second conductor layer 134 provides enhanced current carrying capabilities for electrical connections to power semiconductor device 102 while creating a recess or opening 166 for placement of digital semiconductor device 104. In the embodiments described herein, thickness 156 may be in the range of 25 μm-250 μm and thickness 122 may be in the range of 4 μm-30 μm. However, it is contemplated that first and second conductor layers 118, 134 may be formed having thicknesses outside these ranges of values in alternative embodiments. In alternative embodiments, second conductor layer 134 may be formed with a thickness equal to or less than thickness 122 of first conductor layer 118.

Together, the first conductor layer 118 and second conductor layer 134 create a multi-thickness conductor 168 that extends through insulating substrate 108 and has high density routing capabilities for digital semiconductor device 104 and high current carrying capabilities for power semiconductor device 102. Multi-thickness conductor 168 has an overall thickness 170 equal to the combined thicknesses 122 of the first conductor layer 118 and second conductor layer 134 plus the thickness 132 of the insulating substrate 108.

Figure 8:
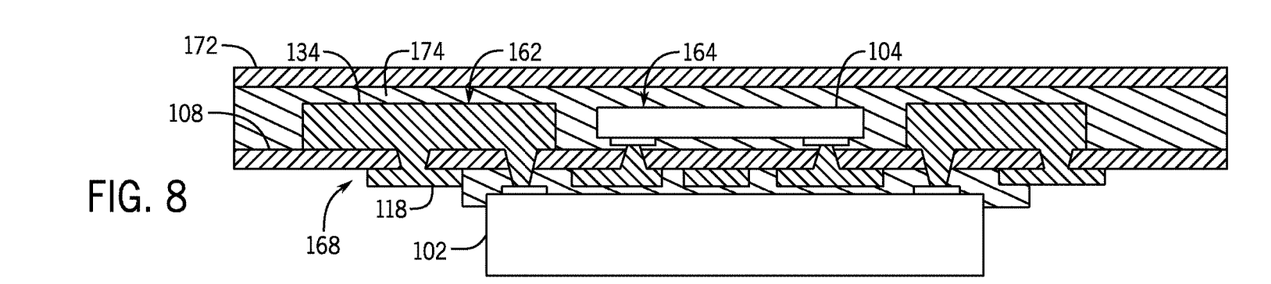
Figure 9:
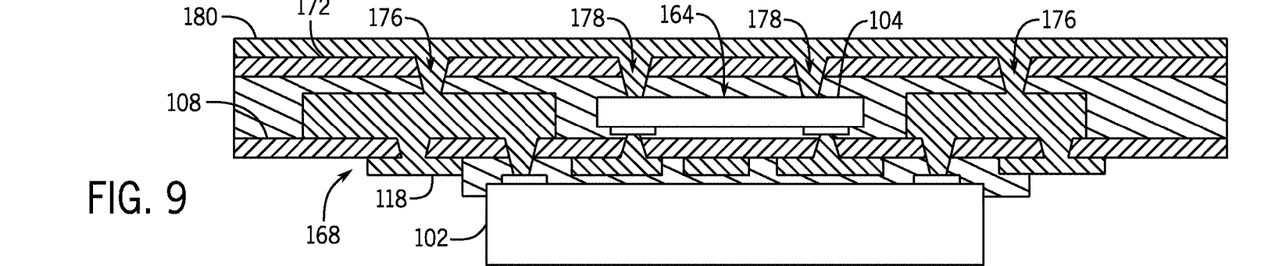

Referring to FIG. 8, a second insulating substrate 172 is coupled to top surface 162 of second conductor layer 134 and second surface 164 of digital semiconductor device 104 with a layer of insulating material 174. In one embodiment, insulating material 174 fills any voids between insulating substrate 108 and second insulating substrate 172. In an alternative embodiment, an electrically insulating material is used to fill any voids between substrates 108, 172 in a later step of the build-up process. After insulating material 174 is cured, a series of vias 176, 178 are formed through second insulating substrate 172, as shown in FIG. 9. Vias 176 are aligned with portions of second conductor layer 134 and vias 178 are aligned with contact pads locations on the second surface 164 of digital semiconductor device 104. One skilled in the art will recognize that vias 178 may be omitted in embodiments where the second conductor layer 134 of device 104 does not include any contact pads.

Figure 10:
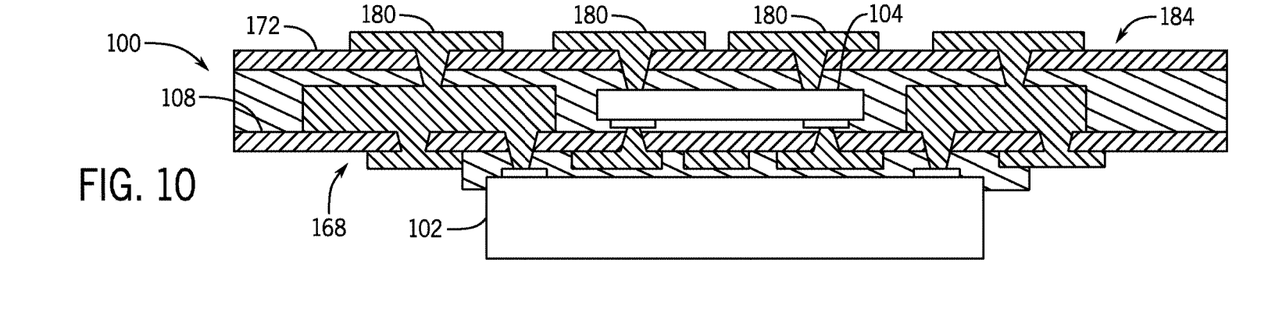

Another conductor layer 180 is formed on a top surface 182 of second insulating substrate 172 in a similar manner as described with respect to first conductor layer 118. Conductor layer 180 extends through vias 176, 178 to electrically coupled with digital semiconductor device 104 and second conductor layer 134. Optionally, a seed metal layer (not shown) may be applied to top surface 182 prior to formation of conductor layer 180. Portions of conductor layer 180 are then removed using a masking and etching technique similar to that described above to yield a patterned redistribution layer 184, as shown in FIG. 10. Additional redistribution layers (not shown) may be formed atop redistribution layer 184 in a similar manner to achieve a desired I/O configuration for external connection between package 100 and power and digital semiconductor devices 102, 104.

Figure 15:
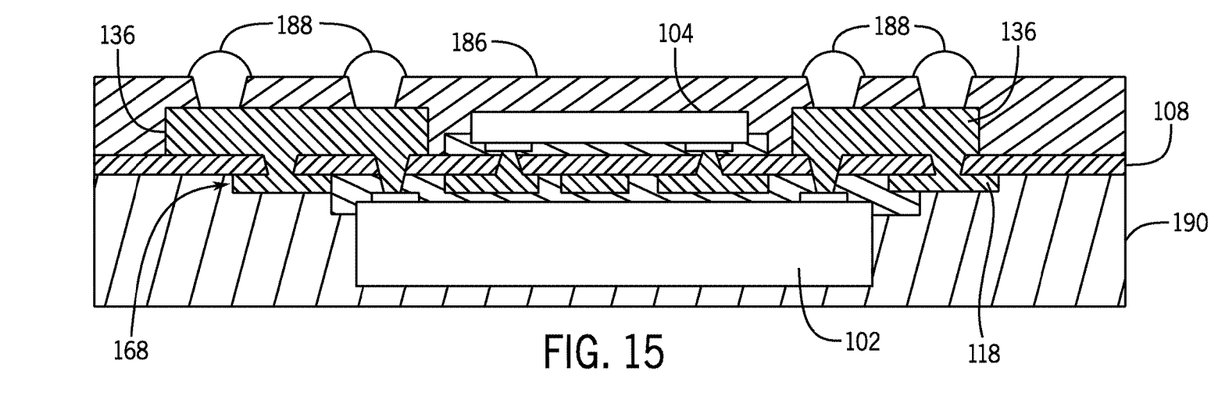
FIG. 15 is a schematic cross-sectional side view of the electronics package of FIG. 7 further including an insulating material surrounding the electrical components, according to another embodiment of the invention.
Figure 16:
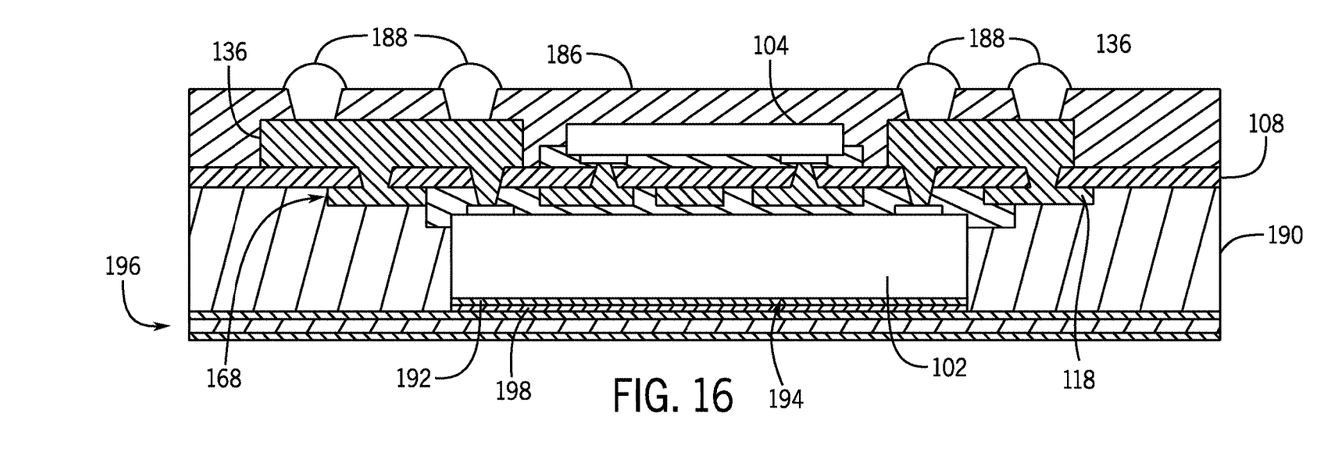
FIG. 16 is a schematic cross-sectional side view of an electronics package of FIG. 7 further including a direct bond copper (DBC) substrate, according to another embodiment of the invention.

Referring to FIGS. 15 and 16, a solder mask layer 186 may be applied over the second conductor layer 134 of electronics package 100 to provide a protective coating and define interconnect pads. Interconnect pads may have a metal finish, such as Ni or Ni/Au, to aid solderability. A series of input/output (I/O) connections 188 are then made to provide a route for electrical connections between the power semiconductor device 102, digital semiconductor device 104, and external components (not shown) such as, for example a busbar or printed circuit board (PCB). Such I/O connections 188 may be provided in the form of plated bumps or pillar bumps, as non-limiting examples. In alternative embodiments that include one or more redistribution layers 184, solder mask layer 186 and I/O connections 188 are formed on the top surface thereof.

In some embodiments, power semiconductor device 102 and digital semiconductor device 104 are overcoated with a layer of electrically insulating material 190 to provide rigidity and ease of handling and to prevent arcing between semiconductor devices and other metal components in high voltage applications. Such a configuration is shown in FIG. 15 and is applicable in embodiments where the power semiconductor device 102 is a lateral device that does not include a connection to the backside of the device 102.

In embodiments where power semiconductor device 102 includes one or more lower collector pad or contact pad 192 positioned on its backside or lower surface 194, as shown in FIG. 16, a conductive substrate 196 may be provided to create an electrical connection to lower contact pad 192. Conductive substrate 196 may be an encapsulated metal lead frame or a multi-layer substrate such as, for example, a printed circuit board (PCB) or DBC substrate as shown in the illustrated embodiment that includes a non-organic ceramic substrate with upper and lower sheets of copper bonded to both sides thereof with a direct bond copper interface or braze layer. The electrical connection between conductive substrate 196 and power semiconductor die 102 is made through a conductive joining layer 198, such as solder, conductive adhesive, or silver paste, as examples, which is formed on lower contact pad 192. In such an embodiment, the connection between conductive substrate 196 and the lower contact pad 192 of power semiconductor device 102 is made prior to filling the volume between the conductive substrate 196 and the insulating substrate 108 with electrically insulating material 190.

An alternative technique for manufacturing an electronics package 200 is illustrated in FIGS. 17-21. Electronics package 200 includes a number of similar components as electronics package 100 (FIG. 9) and similar part numbers are used where appropriate. The manufacturing technique of FIGS. 17-21 differs from that of FIGS. 2-10 in the manner in which power semiconductor device 102 is attached to insulating substrate 108 and electrically connected to second conductor layer 134, as described below.

Figure 17:
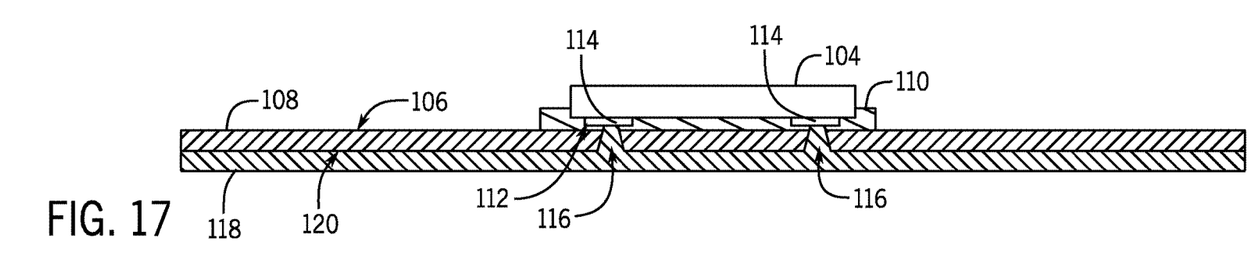
FIGS. 17-21 are schematic cross-sectional side views of an electronics package during various stages of a manufacturing/build-up process, according to another embodiment of the invention.

Similar to the manufacturing technique described with respect to FIGS. 2 and 3, fabrication of electronics package 200 begins by applying a layer of insulating material 110 to the top surface 106 of insulating substrate 108 and positioning the active surface 112 of digital semiconductor device 104 into insulating material 110, as shown in FIG. 17. After forming vias 116 through insulating substrate 108, the first conductor layer 118 is plated on the bottom surface 120 thereof. First conductor layer 118 extends through vias 116 and forms electrical connections to contact pads 114 of digital semiconductor device 104.

Figure 18:
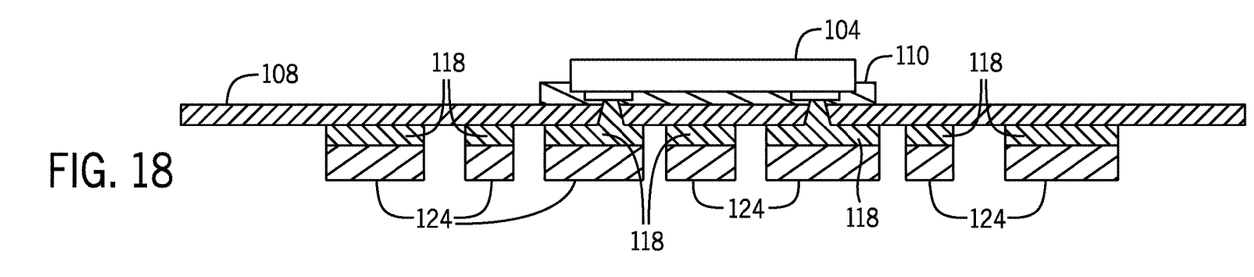
Figure 19:
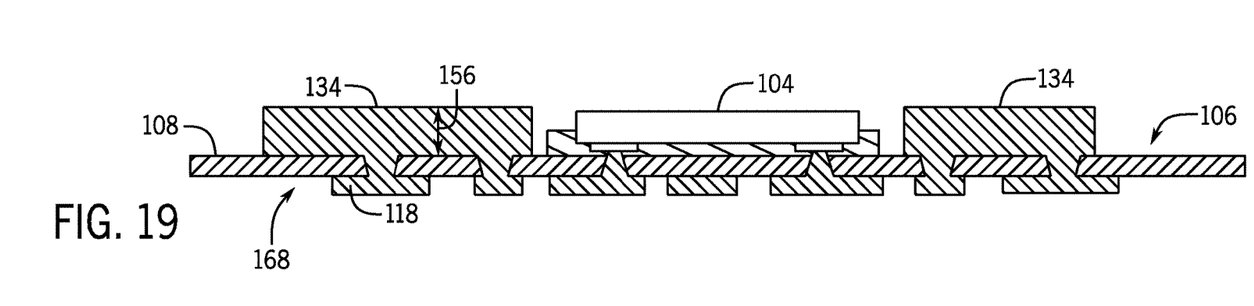

Referring now to FIG. 18, a first layer photoresist mask 124 is applied to mask the portion of first conductor layer 118 corresponding to the high density L/S pattern. With the first layer photoresist mask 124 in place, an etching technique is used to remove portions of the first conductor layer 118 exposed by the first layer photoresist mask 124 to yield a patterned first conductor layer 118. After etching is complete, the remaining portions of first layer photoresist mask 124 are removed using a stripping technique.

Next, a second conductor layer 134 (FIG. 19) is plated on the top surface 106 of insulating substrate 108 and patterned with a low density L/S pattern in a similar manner as described above. Second conductor layer 134 is formed having a thickness 156 that provides requisite current carrying capabilities for power semiconductor device 102. A redistribution layer 184 (FIG. 20) is formed atop second conductor layer 134 and digital semiconductor device 104 in a similar manner as described with respect to FIGS. 8-10.

Figures 20, 21:
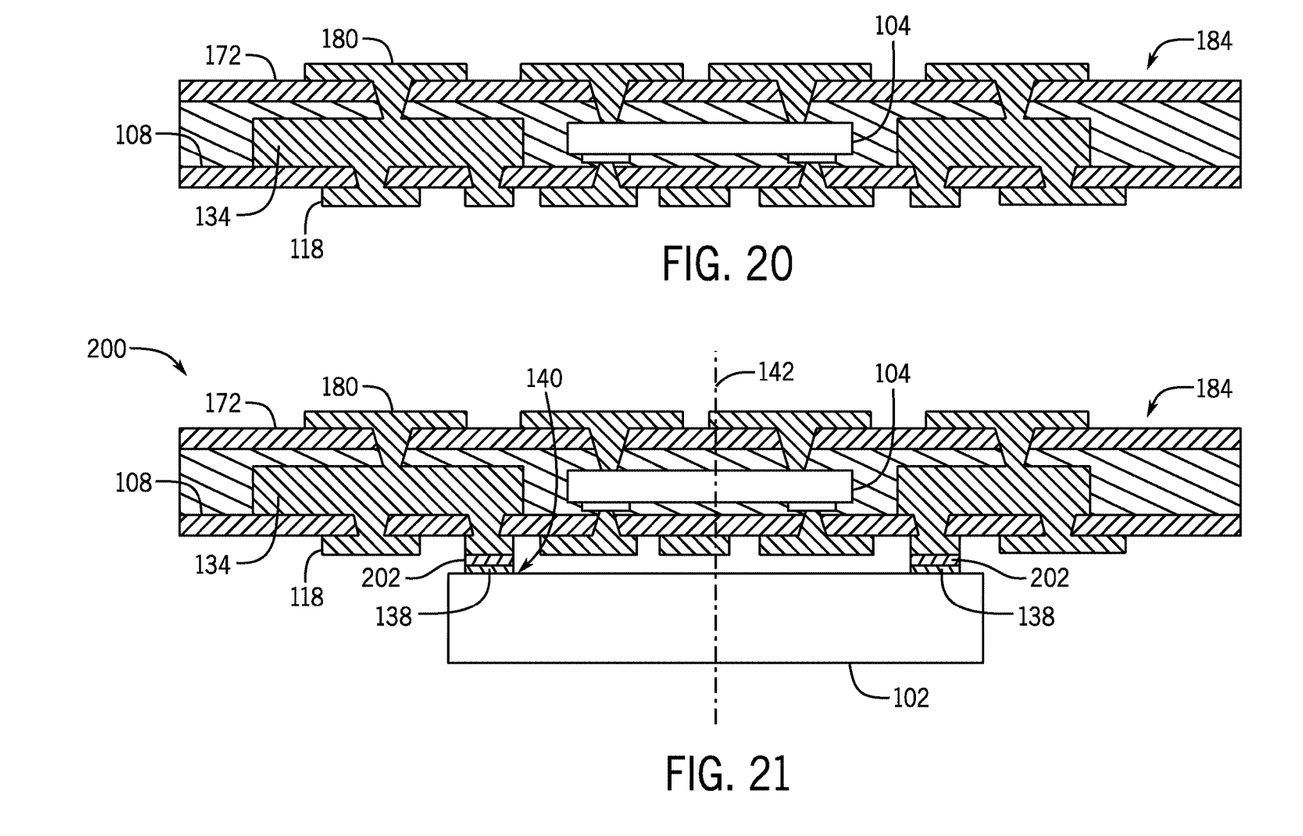

Referring to FIG. 21, a joining material 202 is used to mechanically and electrically couple power semiconductor device 102 to first conductor layer 118. According to various embodiments, joining material 202 may be solder, sintered silver, a conductive adhesive such as a polymer filled with an electrically conductive filler such as silver, or another electrically conductive material able to withstand high temperatures. In one embodiment, a liquid phase bonding joining technique is used to couple power semiconductor device 102 to first conductor layer 118. As shown, joining material 202 is electrically coupled to contact pads 138 or connection pads located on the active surface 140 of power semiconductor device 102. Optionally, one or multiple organic or inorganic coating layers (not shown), such as organic solderability preservative (OSP) or Ni/Au, may be applied to first conductor layer 118 to aid in adhesion of power semiconductor device 102. In some embodiments, the void between power semiconductor device 102 and digital semiconductor device 104 is filled with a non-conductive material (not shown).

In the fabrication technique described above, power semiconductor device 102 is affixed to first conductor layer 118 as a final step of the fabrication technique. Doing so beneficially permits multi-thickness conductor 168 to be tested prior to attaching the costly power semiconductor device 102. In alternative embodiments, power semiconductor device 102 may be affixed to first conductor layer 118 at any time after it is formed.

Similar to the embodiments illustrated in FIGS. 15 and 16, fabrication of electronics package 200 may also include the addition of an encapsulant and I/O connections. Where one or more of the embedded electrical components includes a backside contact pad, similar to contact pad 192 of FIG. 15, a conductive substrate may be included to provide an electrical connection thereto.

Beneficially, arranging semiconductor devices in a stacked arrangement in the manner described herein permits very short conductor runs between the semiconductor devices, thereby improving signal fidelity and reliability within the packaging structure and overall electrical performance of the package. Furthermore, incorporation of the multi-thickness conductor described herein enables locating disparate electrical components much closer in proximity to each other than prior art techniques such as that shown in FIG. 1, further enhancing the ability to reduce the length of conductor runs while providing the requisite high density routing capabilities and high current carrying capabilities for the different types of electrical components.

Therefore, according to one embodiment of the invention, an electronics package includes an insulating substrate, a first electrical component coupled to a top surface of the insulating substrate, and a second electrical component coupled to a bottom surface of the insulating substrate. A first conductor layer is formed on the bottom surface of the insulating substrate and extends through a via formed therethrough to contact a contact pad of the first electrical component, with a portion of the first conductor layer positioned between the insulating substrate and the second electrical component. A second conductor layer is formed on the top surface of the insulating substrate and extends through another via formed therethrough to electrically couple with the first conductor layer and to contact a contact pad of the second electrical component.

According to another embodiment of the invention, a method of manufacturing an electronics package includes coupling a first electrical component to a top surface of an insulating substrate and forming a first conductor layer on a bottom surface of the insulating substrate, where the first conductor layer extends through at least one via in the insulating substrate to electrically couple with at least one contact pad of the first electrical component. The method also includes coupling a second electrical component to the bottom surface of the insulating substrate such that a portion of the first conductor layer is positioned therebetween and forming a second conductor layer on a top surface of the insulating substrate, the second conductor layer extending through another via in the insulating substrate to electrically couple with the first conductor layer. The second conductor layer is electrically coupled to at least one contact pad of the second electrical component.

According to yet another embodiment of the invention, a stacked electronics package includes a pair of electrical components coupled to opposing surfaces of an insulating substrate in a stacked configuration wherein an active surface of one electrical component faces an active surface of the other electrical component. A first conductor layer is formed on a first surface of the insulating substrate and is electrically coupled to one electrical component through a via formed in the insulating substrate. A second conductor layer is formed on a second surface of the insulating substrate and is electrically coupled to the other electrical component through another via formed in the insulating substrate. A portion of the first conductor layer is positioned between the pair of electrical components.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
    an insulating substrate;
    a first electrical component coupled to a top surface of the insulating substrate;
    a second electrical component coupled to a bottom surface of the insulating substrate;
    a first conductor layer disposed over a portion of the bottom surface of the insulating substrate and extending through a via formed therethrough to contact a contact pad of the first electrical component; and
    a second conductor layer disposed over a portion of the top surface of the insulating substrate, extending through another via formed therethrough to electrically couple with the first conductor layer, and extending through yet another via formed therethrough to contact a contact pad of the second electrical component;
    wherein a portion of the first conductor layer is positioned between the insulating substrate and the second electrical component.

2. The electronics package of claim 1 wherein the first conductor layer is thinner than the second conductor layer.

3. The electronics package of claim 1 wherein the first electrical component comprises a digital semiconductor device; and
    wherein the second electrical component comprises a power semiconductor device.

4. The electronics package of claim 1 wherein the first electrical component has a greater number of contact pads than the second electrical component.

5. The electronics package of claim 1 wherein the first electrical component is thinner than the thickness of the second conductor layer.

6. The electronics package of claim 1 wherein an active surface of the first electrical component having at least one contact pad thereon is positioned facing an active surface of the second electrical component having at least one contact pad thereon.

7. The electronics package of claim 1 wherein the first electrical component and the second electrical component are arranged in a stacked configuration.

8. The electronics package of claim 7 wherein the first electrical component is aligned with the second electrical component along a common vertical axis.

9. The electronics package of claim 1 further comprising a redistribution layer formed atop and electrically coupled to the second conductor layer.

10. The electronics package of claim 1 wherein the bottom surface of the insulating substrate has an adhesion layer and a seed layer applied thereto.

11. The electronics package of claim 1 wherein the top surface of the insulating substrate has an adhesion layer and a seed layer applied thereto.

12. A method of manufacturing an electronics package comprising:
    coupling a first electrical component to a top surface of an insulating substrate;
    forming a first conductor layer on a bottom surface of the insulating substrate, the first conductor layer extending through at least one via in the insulating substrate to electrically couple with at least one contact pad of the first electrical component;
    coupling a second electrical component to the bottom surface of the insulating substrate such that a portion of the first conductor layer is positioned therebetween; and
    forming a second conductor layer on a top surface of the insulating substrate, the second conductor layer extending through another via in the insulating substrate to electrically couple with the first conductor layer;

wherein the second conductor layer is electrically coupled to at least one contact pad of the second electrical component.

13. The method of claim 12 further comprising forming the second conductor layer having a thickness greater than a thickness of the first conductor layer.

14. The method of claim 12 further comprising forming the second conductor layer to surround at least a portion of the first electrical component.

15. The method of claim 12 further comprising coupling the second electrical component such that active surface thereof faces an active surface of the first electrical component.

16. The method of claim 12 further comprising arranging the first electrical component and the second electrical component to at least partially overlap in a vertical direction.

17. The method of claim 12 further comprising:
patterning the first conductor layer to define a high density L/S (line/space) routing pattern; and
patterning the second conductor layer to define a low density L/S (line/space) routing pattern.

18. The method of claim 12 further comprising:
applying an adhesion layer and a seed layer to the bottom surface of the insulating substrate prior to forming the first conductor layer; and
applying an adhesion layer and a seed layer to the top surface of the insulating substrate prior to forming the second conductor layer.

19. A stacked electronics package comprising:
a pair of electrical components coupled to opposing surfaces of an insulating substrate in a stacked configuration wherein an active surface of one electrical component faces an active surface of the other electrical component;
a first conductor layer coupled to a bottommost surface of the insulating substrate and extending through a via in the insulating substrate to electrically couple to one electrical component of the pair of electrical components; and
a second conductor layer coupled to a topmost surface of the insulating substrate and extending through another via in the insulating substrate to electrically couple to the other electrical component of the pair of electrical components;
wherein a portion of the first conductor layer is positioned between the pair of electrical components.

20. The stacked electronics package of claim 19 wherein the second conductor layer has a thickness greater than a thickness of the first conductor layer.

21. The stacked electronics package of claim 19 wherein the pair of electrical components comprises a digital semiconductor device and a power semiconductor device.

22. The stacked electronics package of claim 19 wherein the first conductor layer comprises a high density L/S (line/space) pattern; and
wherein the second conductor layer comprises a low density L/S (line/space) pattern.

23. The stacked electronics package of claim 19 further comprising a redistribution layer formed atop the second conductor layer and electrically coupled thereto.

24. The stacked electronics package of claim 19 wherein at least one of the bottommost surface and the topmost surface of the insulating substrate have an adhesion layer and a seed layer applied thereto.

* * * * *